United States Patent
Narita et al.

[11] Patent Number: 5,982,037
[45] Date of Patent: *Nov. 9, 1999

[54] AL/TI LAYERED INTERCONNECTION AND METHOD OF FORMING SAME

[75] Inventors: Tadashi Narita; Yusuke Harada, both of Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/814,589

[22] Filed: Mar. 10, 1997

[30] Foreign Application Priority Data

Jul. 10, 1996 [JP] Japan ..................... 8-180926

[51] Int. Cl.$^6$ ................. H01L 23/48; H01L 23/52; H01L 29/40
[52] U.S. Cl. ............... 257/765; 257/771; 257/763; 438/688; 438/685
[58] Field of Search ............... 257/763, 764, 257/771, 765; 438/582, 648, 656, 597, 688

[56] References Cited

U.S. PATENT DOCUMENTS

| | | | |
|---|---|---|---|
| 4,218,291 | 8/1980 | Fukuyama et al. | |
| 4,673,623 | 6/1987 | Gardner et al. | 257/771 |
| 5,313,101 | 5/1994 | Harada et al. | 257/765 |
| 5,355,020 | 10/1994 | Lee et al. | |

FOREIGN PATENT DOCUMENTS

| | | |
|---|---|---|
| 0 552 968 A2 | 7/1993 | European Pat. Off. |
| 0 720 231 A2 | 7/1996 | European Pat. Off. |
| 4-186629 | 7/1992 | Japan |

OTHER PUBLICATIONS

"Characteristics of aluminum–titanium electrical contacts on silicon", Robert W. Bower, Appl. Phys. Lett., vol. 23, No.2, Jul. 15, 1973 pp. 99–101.

"The thermal stability of Al/Ti–Ta metallization on Si", M. Ben–Tzur and M. Eisenberg, J. Appl. Phys. 69 (7), Apr. 1991, pp. 3907–3914.

"Interface Reactions in Al/Ti Layered Structures", Tadashi Narita et al., Extended Abstracts of the 1994 International conference on Solid State Device and Materials, Yokohama, 1994, pp. 952–954.

"A High Performance, Four Metal Layer Interconnect System for Bipolar and BIVMOS Circuits", S.R. Wilson et al., Jun. 12–13, 1990 VMIC Conference TH–03525–1/90/0000–0042 $01.00 C 1990 IEEE, pp. 42–48.

"Al–PLAPH (Aluminum–Planarization by Post–Heatin) Process for Planarized Doub;e Metal CMOS Applications", C.C.Park et al., Jun. 11–12, 1991 VMIC Conference TH–0359–0/91/0000–0326 $01.00 C 1991 IEEE, pp. 326–328.

*Primary Examiner*—Sheila V. Clark
*Attorney, Agent, or Firm*—Venable; Robert J. Frank

[57] ABSTRACT

In order to provide an Al/Ti layered interconnection which comprises a Ti (titanium) layer and an Al layer composed of Al (aluminum) or an Al alloy both formed over a base in this order and is capable of retarding a reaction between Ti and Al and preventing pinholes from occurring, the present invention is characterized as follows: The Al layer contains Si (silicon) in a portion adjacent to the Ti layer in a concentration capable of retarding an interface reaction between Ti and Al. Further, the concentration of Si in an Al layer portion on the side above the adjacent portion is set to a concentration lower than a concentration for allowing the upper Al layer portion to produce pinholes even at the maximum.

25 Claims, 11 Drawing Sheets

(example for Al-0.8%Si-Cu/Ti)

(example for Al-Cu/Ti)

AL/TI LAYERED INTERCONNECTION AND METHOD OF FORMING SAME

BACKGROUND OF THE INVENTION

1. Field of the Invention

This invention relates to a structure of an Al/Ti layered interconnection heavily used as an interconnection or the like for a semiconductor device and a method of forming the same.

2. Description of the Related Art

An Al/Ti stacked or layered interconnection has been known as an interconnection for providing excellent resistance to electromigration (EM). Since Al formed over Ti (normally oriented to a (0002) surface or plane) is firmly oriented onto a (111) plane and an interconnection in which a small amount of Ti has entered an Al layer, is enhanced, the EM resistance has been considered to improve. It is however known that when a structure formed by simply stacking a Ti layer and an Al layer on each other is used, both layers undergo a chemical reaction at an interface between the layers by a heat treatment (corresponding to heat treatment often used during a manufacturing process of a semiconductor device) at a temperature of 400° C. or above thereby to increase wiring resistances. This has been disclosed in, for example, a reference I: Appl. Phys. Lett., vol. 23, No. 2, 15, p.99 (1973) and a reference II: J. Appl. Phys., 69(7), p.3907 (1991). Therefore, an Al layer containing Si has been used as the Al layer in the Al/Ti layered interconnection. This is because the reaction between Ti and Al can be retarded owing to the containing of Si in the Al layer. This has been described in, for example, a reference III proposed by inventors of this application, "Extended Abstracts of the 1994 International Conference on Solid State Devices and Materials, Yokohama), 1994, pp.952–954.

SUMMARY OF THE INVENTION

According to detailed investigations carried out by the inventors of the present application, it became apparent that pinholes would occur in the Al layer according to the concentration of Si when Si was contained in the Al layer of the Al/Ti layered interconnection. This will be described below in detail.

A Ti layer having a thickness of 50 nm and an Al layer (to be described in detail later) having a thickness of 500 nm were continuously formed over a BPSG (Boro-Phospho silicate glass) film of a silicon substrate with the BPSG (Boro-Phospho silicate glass) film formed over the surface thereof, by a sputtering process to prepare an evaluation sample. However, samples of five standards or levels, in which the Al layer is represented in the form of (1): Al—Cu layer (i.e., an Al—Cu alloy layer zero in Si content), (2): Al-0.3%Si—Cu layer, (3): Al-0.5%Si—Cu layer, (4): Al0.8%Si—Cu layer and (5): Al-2.0%Si—Cu layer, were prepared. Here, Al-0.3%Si and Al-0.5%Si means that Si are respectively contained in the proportions of 0.3 per cent by weight and 0.5 per cent by weight for Al. Incidentally, a film-forming condition at the time of sputtering was set as follows: A film-forming temperature, film-forming pressure and power of the Ti layer were respectively set to 100° C., 3 mTorr and 1 KW. Further, a film-forming temperature, film-forming pressure and power of the Al layer were respectively set to 250° C., 2 mTorr and 9 KW.

The surfaces of the samples prepared in the above-described manner were observed and photographed by a scanning electron microscope (SEM) in a state prior to the next process immediately after the completion of a deposition process such as sputtering (hereinafter called "as-depo"). Here, SEM photographs each magnified about 12,000 times by the scanning electron microscope were respectively taken. It was further measured whether pinholes would appear in a region corresponding to an area of 525 $\mu m^2$ in each photograph. Here, the number of the pinholes each larger than about 0.05 $\mu m$ in diameter was measured every samples having the respective standards. The numbers of pinholes for the respective standards in which Si concentrations were set to 0.3, 0.5 and 0.8 per cents by weight, were shown in FIG. 9 by bar graphs as a part of the result of measurement. It can be understood from FIG. 9 that no pinholes are not observed in an Al/Ti layered interconnection having an Al layer in which the concentration of Si is set to 0.3 per cent by weight, whereas a number of pinholes are observed in an Al/Ti layered interconnection having an Al layer in which the concentration of Si is set to 0.5 per cent or higher by weight. FIG. 10(A) is a view showing a copy of a surface SEM photograph of an Al/Ti layered interconnection in which the concentration of Si is set to 0.8 per cent by weight, i.e., an Al-0.8wt%Si—Cu/Ti layer is formed. Further, FIG. 10(B) illustrates a copy of a surface SEM photograph of an Al—Cu/Ti layered interconnection in which the concentration of Si is zero, i.e., an Al—Cu layer is formed. It is understood that pinholes P are observed in FIG. 10(A) and no pinholes are observed in FIG. 10(B). Even when the samples given in the form of the respective standards are subjected to heat treatment in an atmosphere of nitrogen at temperatures of about 410° C., 450° C. and 500° C. for 30 minutes, the situation in which pinholes occur, substantially remains unchanged as upon as-depo. It can be understood from the above description that the pinholes will occur in the Al layer according to the concentration of Si contained in the Al layer in the Al/Ti layered interconnection.

The pinholes are considered to cause void, in its turn have some fear for a reduction in resistance to electromigration. With advances in micronization of a semiconductor device, the more the interconnection is micronized, the more the fear is increased.

It is considered that in order to avoid this, Si is not allowed to be contained in the Al layer, or even when Si is contained therein, Si may be contained therein by an amount (corresponding to 0.3 per cent by weight even at the maximum judging from the experimental results described with reference to FIG. 9 by way of example) lower than an amount required to allow the Al layer to produce the pinholes. However, this will cause a reduction in wiring resistance due to the reaction between Ti and Al as already described above and as will be described below in detail using FIG. 11. FIG. 11 is a diagram obtained by determining the rate of change in sheet resistance AR/Ro from a sheet resistance $R_0$ at as-depo, of each of the samples having the five standards used in the experiments for making a decision as to whether or not the pinholes occur, and a sheet resistance of each sample heat-treated at the temperatures of about 410° C., 450° C. and 500° C. and plotting the rate of change in sheet resistance with respect to each temperature for heat treatment. In FIG. 11, a characteristic indicated by black dots or circles shows that the Al layer in the Al/Ti layered interconnection is the Al—Cu layer. A characteristic indicated by white circles exhibits that the Al layer is the Al-0.3%Si—Cu layer. A characteristic indicated by black square marks shows that the Al layer is the Al-0.5%Si—Cu layer. A characteristics indicated by white square marks exhibits that the Al layer is the Al-0.8%Si—Cu layer.

Further, a characteristic indicated by white triangular marks shows that the Al layer is the Al-2.0%Si—Cu layer.

Judging from the results shown in FIG. 11, the change in sheet resistance is still large before and after the heat treatment in the case of the Al/Ti interconnection having the Al layer in which the concentration of Si is set to 0.3 per cent by weight. In contrast to this, the change in sheet resistance are approximately the same before and after the heat treatment of the samples in the case of the Al/Ti interconnections having the Al layers in which the Si concentrations are respectively set to 0.8 per cent by weight and 2.0 per cent by weight. It is thus preferable from the experimental results to contain Si in the Al layer in a concentration of at least 0.8 per cent by weight to control an increase in wiring resistance due to the reaction between Ti and Al. However, this cannot prevent the pinholes from occurring.

There has been a demand for the appearance of an Al/Ti layered interconnection having a structure capable of avoiding the reaction between Ti and Al and preventing pinholes from occurring in an Al layer. It has also been desired to propose a method capable of easily forming such an Al/Ti layered interconnection.

Therefore, the inventors of the present application have invented the following structure suitable for an Al/Ti layered interconnection comprising an Ti (titanium) layer, and an Al layer composed of Al (aluminum) or an Al alloy both of which are formed over a base or substrate in this order.

Namely, the Al layer contains Si (silicon) in a portion adjacent to the Ti layer in a concentration capable of retarding an interface reaction between Ti and Al. Further, the concentration of Si contained in a portion located on the side above the adjacent portion is set to a concentration lower than a concentration for allowing the upper Al layer portion to produce pinholes even at the maximum.

According to the present invention, an Al/Ti layered interconnection can be obtained which has an Al layer of a structure wherein Si is contained by a needed amount only in a portion required to retard the reaction between Ti and Al and Si is not contained to the utmost in portions other than the portion (inclusive of the case in which no Si is contained). Therefore, the Al/Ti layered interconnection can be realized which is capable of preventing the reaction between Ti and Al and the occurrence of the pinholes.

It is considered that the concentration of Si contained in the upper Al layer portion may preferably be 0.3 per cent by weight even at the maximum upon execution of the present invention. This is because if the upper limit of the Si concentration is set in this way, then the pinholes are considered to be capable of being prevented from occurring in the Al layer in terms of the experimental results described using FIG. 9. It is also preferable to make the thickness of the upper Al layer portion thicker than that of the Al layer portion corresponding to the portion adjacent to the Ti layer. This is because if the Al layer portion adjacent to the Ti layer is excessively thick, then the proportion of the same to the Al layer increases to enhance the risk of the occurrence of the pinholes. Therefore, the Al layer portion corresponding to the portion adjacent to the Ti layer is eventually made relatively thin. When the thickness of the upper Al layer portion is thinner than that of the Al layer portion corresponding to the portion adjacent to the Ti layer in such a case, it is considered that (1): since the upper Al layer portion is susceptible to Si contained in the portion adjacent to the Ti layer, a risk, which leads to the generation of the pinholes, is easy to occur and (2): since the total thickness of the Al/Ti layered interconnection becomes thin, wiring resistance increases. In regard to determination about to which extent the concentration of Si in the Al layer portion adjacent to the Ti layer, i.e., the Si concentration capable of retarding the reaction between Ti and Al should be set, the Si concentration may be set to as low as possible in consideration of determination about to what extent the change in wiring resistance should be allowed. The Si concentration is not necessarily limited to this. Since it can be said that a resistance-change control effect is being substantially saturated when the Si concentration exceeds 0.8 per cent by weight, judging from the experimental examples described with reference to FIG. 11 (i.e., since the rate of change in resistance is approximately the same in the case of the standard in which the Si concentration is 0.8 per cent by weight and the standard in which the Si concentration is 2.0 per cent by weight), the Si concentration may be set to a concentration beyond 0.8 per cent by weight and as low as possible.

Further, according to the invention descriptive of a method of forming an Al/Ti layered interconnection, comprising a step for forming a Ti layer over a base, and a step for forming an Al layer composed of Al or an Al alloy over the Ti layer, the Al layer is formed by continuously executing under vacuum, a first step for forming an Al layer portion on condition that Si is contained in the Al layer in a concentration capable of retarding an interface reaction between Ti and Al and a second step for forming an Al layer portion on condition that Si is not substantially contained in the Al layer or the concentration of Si becomes a concentration lower than a concentration required to allow the Al layer to produce pinholes even at the maximum. Here, the term "under vacuum" means that the Al layer portion formed in the first step is transferred to the second step without being oxidized.

As one example of such a method, may be mentioned, a method using a sputter device having at least a first film-forming chamber provided with an Al target containing a predetermined amount of Si and a second film-forming chamber provided with a target containing no Si or containing Si of a predetermined amount or less and having a transfer mechanism capable of transferring samples between these film-forming chambers without exposing the samples to the atmosphere. Further, the following method is known as a simpler method.

Namely, there is provided a method of forming an Al/Ti layered interconnection, comprising a step for forming a Ti layer over a base and a step for forming an Al layer composed of Al or an Al alloy over the Ti layer and wherein the Al layer is formed within the same film-forming chamber by a sputtering process using a target uncontaining Si or a target containing Si in a concentration lower than a concentration required to allow the Al layer to produce pinholes even if Si is contained and by a sputtering process for continuously executing without breaking vacuum in the film-forming chamber, a first step for forming an Al layer portion using a mixed gas used as a sputter gas, which is composed of an inert gas and a silane gas, the mixed gas including a silane gas so that the concentration of Si in the formed Al layer becomes a concentration capable of retarding an interface reaction between Ti and Al, and a second step for forming an Al layer portion using an inert gas as a sputter gas.

According to the present method, the film-forming chamber and the target required to form the Al layer may be ones respectively. Therefore, a low-cost process can be realized as compared with the usage of a number of film-forming chambers.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
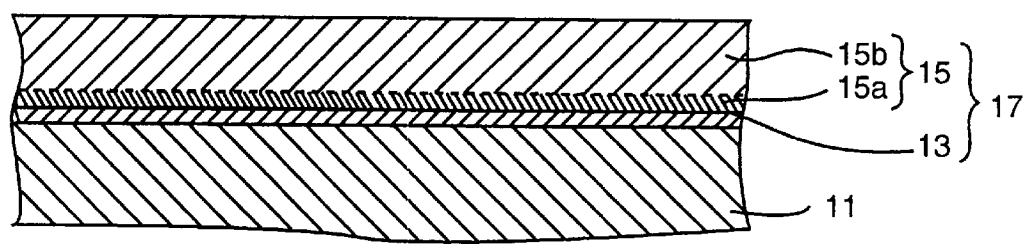
FIG. 1 is a view for describing a first embodiment and a cross-sectional view typically showing a structure of an Al/Ti layered interconnection according to the present invention.

Preferred embodiments each illustrating an Al/Ti stacked or layered interconnection and a forming method therefor according to the present invention will hereinafter be described with reference to the accompanying drawings. Incidentally, the respective drawings used for their description schematically show the relationship between the dimensions, shapes and placement of elements of structure to the degree to which the present invention can be understood. Elements of structure similar to each other in the respective drawings are identified by the same reference numerals and the description of certain common elements will therefore be omitted.

A first embodiment will first be described with reference to FIGS. 1 through 4. FIG. 1 is a cross-sectional view typically showing the structure of an Al/Ti stacked or layered interconnection according to the first embodiment. In FIG. 1, reference numeral 11 indicates an arbitrary substrate or base on which the Al/Ti layered interconnection is formed. Reference numerals 13, 15, 15a, 15b and 17 respectively indicate a Ti layer, an Al layer, an Al layer portion adjacent to the Ti layer 13, an Al layer portion located on the side above the Al layer portion 15a, and the Al/Ti layered interconnection according to the present invention. The Al layer portion 15a adjacent to the Ti layer 13 is of a portion containing Si (silicon) in concentration capable of retarding the interface reaction between Ti and Al. The upper Al layer portion 15b is of a portion in which the concentration of Si is set to a concentration lower than a concentration allowing the upper Al layer portion 15b to produce pinholes even at the maximum (the concentration of Si may be zero).

The sample, which has been described with reference to FIG. 1, can be formed as follows: Now consider an example in which a silicon substrate 11 having a BPSG (Boro-Phospho silicate glass) film (not shown) formed over the surface thereof is used as the base 11. (1) A Ti layer 13 having a thickness of 50 nm, (2) an Al-0.8%Si—Cu layer containing 0.8 per cent Si by weight to Al, containing Cu (copper) and having a thickness of 50 nm, (3) a Cu—Al layer containing Cu except for Si and having a thickness of 45 nm are continuously formed over the BPSG film of the silicon substrate 1 by the sputtering process and without vacuum break of a film-forming chamber. An on-sputtering condition for forming the Ti layer 13 can be set to a condition under which a film-forming temperature (substrate heating temperature) is defined as suitable temperatures ranging from a room temperature to 300° C., the pressure applied to the film-forming chamber is defined as suitable pressures ranging from 1 mTorr to 6 mTorr and the power is defined as suitable powers ranging from 1 KW to 3 KW. An on-sputtering condition for forming the Al-0.8%Si—Cu layer and the Cu—Al layer can be set to a condition under which the film-forming temperature is defined as suitable temperatures ranging from the room temperature to 600° C., the pressure in the film-forming chamber is defined as suitable pressures ranging from 1 mTorr to 6 mTorr and the power is defined as suitable powers ranging from 8 KW to 12 KW. The following two methods may be mentioned by way of example as a method of continuously forming the Ti layer, Al-0.8%Si—Cu layer and Cu—Al layer under vacuum of the film-forming chamber.

Figure 2:
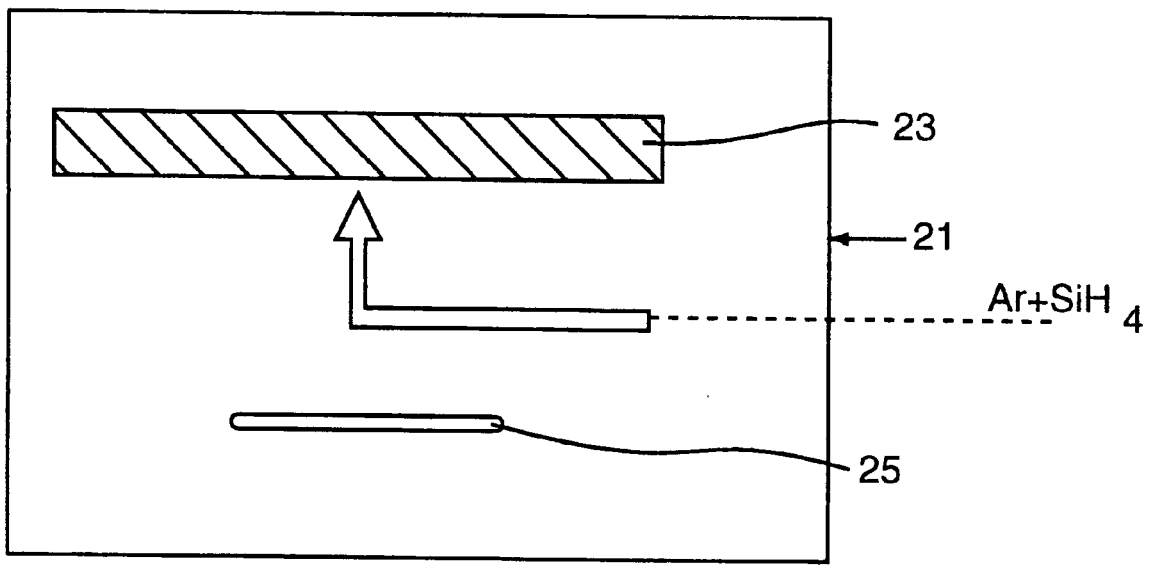
FIGS. 2(A) and 2(B) are respectively views for describing a process for forming an Al layer in particular and are respectively views for explaining examples in which Al layers different in composition from each other are formed by one film-forming chamber and one target.
Figure 2B:
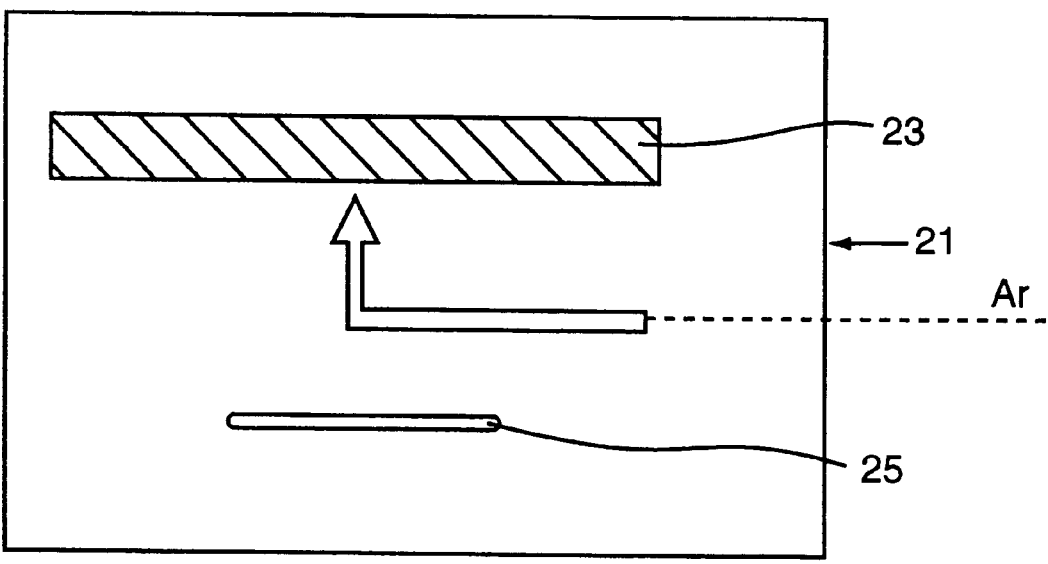

One method is a method using a so-called multi-chamber type sputtering device having a plurality of film-forming chambers, which is capable of providing the transfer of a sample between the respective film-forming chambers under vacuum without the sample being exposed to the atmosphere. In this case, a target of Ti is placed in a certain chamber of the multi-chamber and a target having a composition of Al-0.8%Si—Cu is provided within another chamber. Further, a target having a composition of Al—Cu is placed in a further chamber. In this condition, the sample is shifted or transferred between these chambers so as to continuously execute respective film forming process steps. The other method is a method of devising a process for forming an Al layer in particular. Namely, the present method needs both a film-forming chamber for the Ti layer and a film-forming chamber for the Al layer but uses only one film-forming chamber as for the Al layer. This method will be described in detail with reference to FIGS. 2(A) and 2(B). One film-forming chamber is used as the film-forming chamber for the formation of the Al layer. A target 23 containing no Si or containing Si in a concentration lower than a concentration required to allow the Al layer to generate pinholes even if Si is contained, is disposed within one film-forming chamber 21. In the present embodiment, the target 23 having the composition of Al—Cu, i.e., a target 23 composed of Al—Cu containing no Si or containing 0.3 per cent Si or less by weight for Al even if Si is contained, is placed within the film-forming chamber 21. Incidentally, reference numeral 25 in FIG. 2 indicates a wafer. In a first process for forming the Al-0.8%Si—Cu layer, for example, a mixed gas of Argon (Ar) and monosilane (SiH$_4$) is used as a sputter gas (see FIG. 2(A)). As an alternative to the monosilane, another silane gas, e.g., disilane (Si$_2$H$_6$) may be used. When a gas obtained by mixing monosilane having a flow ratio of about one-tenth of Ar into Ar is used as the sputter gas to sputter an Al—Cu target, the Al-0.8%Si—Cu layer can be formed. In a second process for forming the Al—Cu layer, only Ar is used as the sputter gas exclusive of the monosilane (see FIG. 2(B)).

In the sample formed in this way, the Al-0.8%Si—Cu layer is considered to substantially constitute the Al layer portion 15a adjacent to the Ti layer described in FIG. 1. Further, the Al—Cu layer is considered to form the upper Al layer portion 15b.

Figure 3:
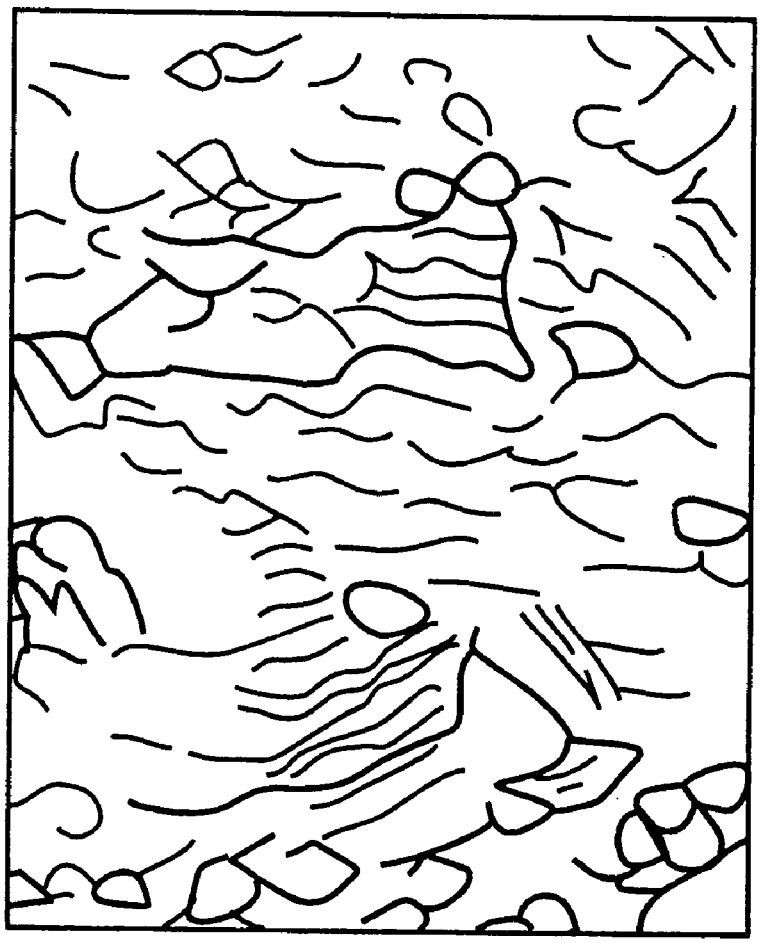
FIG. 3 is a view showing a copy of a photograph obtained by observing the surface of a sample (Al/Ti layered interconnection) according to the present embodiment with a scanning electron microscope.
Figure 4:
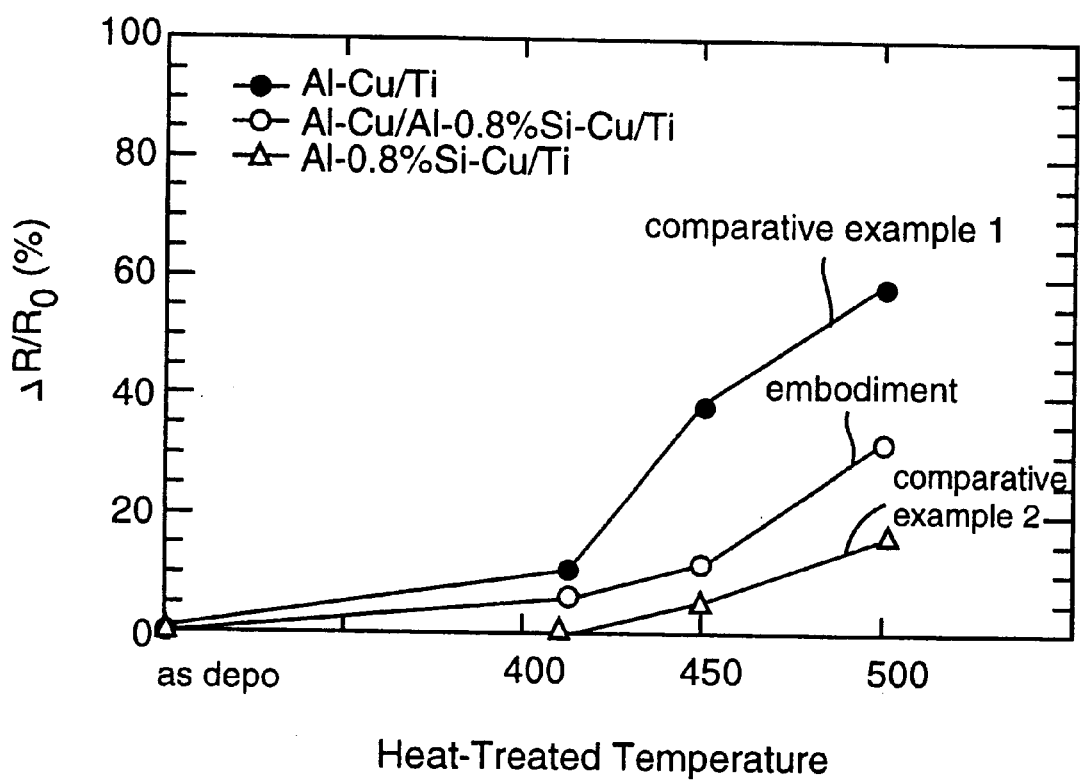
FIG. 4 is a view for describing the first embodiment and a view for explaining the effect of controlling a sheet resistance of the Al/Ti layered interconnection shown in FIG. 1 to heat treatment.

An evaluation sample is formed in accordance with the above-described forming procedure, particularly, in a state in which the on-sputtering condition for forming the Ti layer 13 is set to a condition under which the film-forming temperature is defined as 100° C., the pressure applied to the film-forming chamber is defined as 3 mTorr and the power is defined as 1 KW, the on-sputtering condition for forming the Al-0.8%Si—Cu layer and the Cu—Al layer is set to a condition under which the film-forming temperature is defined as 250° C., the pressure in the film-forming chamber is defined as 2 mTorr and the power is defined as 9 KW. Next, the surface of the sample is observed and photographed by a scanning electron microscope (SEM) in an as-depo condition. A copy or trace of the resultant photograph is illustrated in FIG. 3. It is next determined whether or not pinholes appear in a region corresponding to an area of 525 $\mu$m$^2$ in the photograph. However, the number of pinholes each larger than about 0.05 $\mu$m in diameter is measured here. No pinholes were observed in this sample.

Figure 10A:
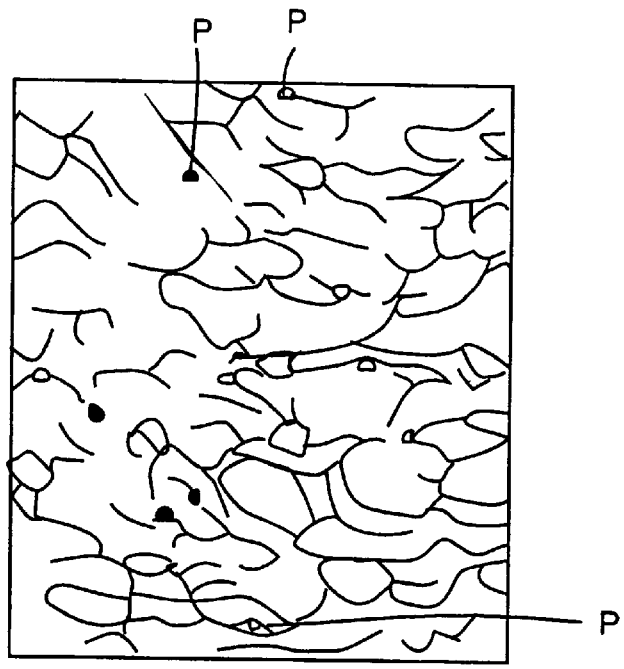
FIG. 10 is a view showing copies of surface SEM photographs at the time of the occurrence and non-occurrence of pinholes.
Figure 10B:
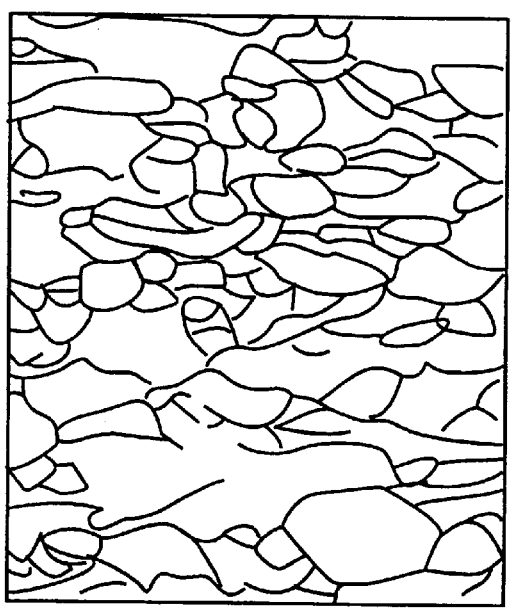
Figure 11:
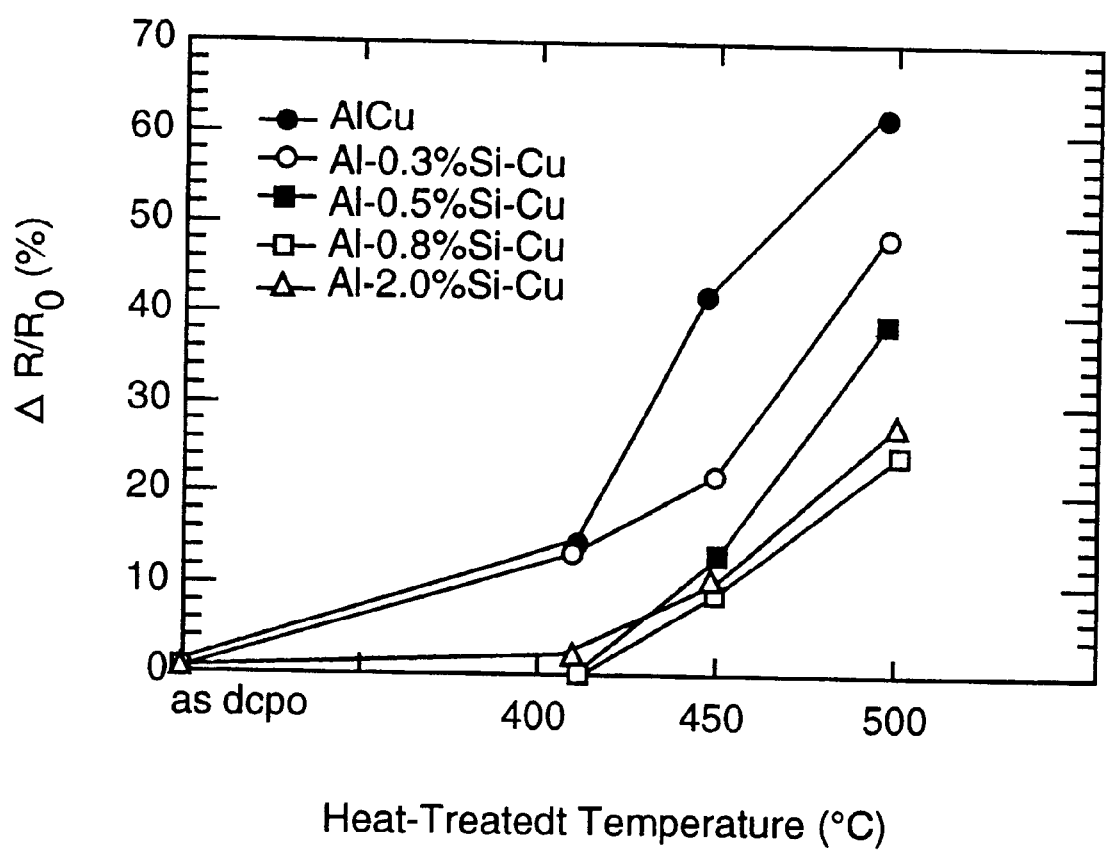
FIG. 11 is a view for describing the relationship between Si concentrations of Al layers in Al/Ti layered interconnections and the rate of change in sheet resistance after heat treatment of the Al/Ti layered interconnections.

Further, the rate of change in sheet resistance $\Delta R/R_0$ is determined from a sheet resistance R0 of this sample at the time of as-depo and sheet resistances obtained by subjecting the sample to heat treatment for 30 minutes in an atmosphere of nitrogen at temperatures of about 410° C., 450° C. and 500° C. The result of determination was shown in FIG. 4 together with comparative examples. Incidentally, the comparative example 1 shows an example in which the entire Al layer is of an Al—Cu layer, i.e., it shows a standard having an Al—Cu/Ti layered interconnection. The comparative example 2 shows an example in which the entire Al layer is of Al-0.8%Si—Cu, i.e., it shows a level or standard having an Al-0.8%Si—Cu/Ti layered interconnection. Conditions for forming samples employed in these comparative examples conform to those employed in the embodiment. It is understood that the sample employed in the embodiment is lower than one employed in the comparative example 1 in the rate of change in resistance. On the other hand, the sample employed in the comparative example 2 is lower in the rate of change in resistance than one employed in the embodiment but has produced pinholes (see FIG. 10(A)).

It is understood from these that according to the Al/Ti layered interconnection of the present invention, an increase in wiring resistance due to the reaction between Ti and Al can be reduced and the pinholes can be also prevented from occurring.

A second embodiment of the present invention will next be described.

Figure 5A:
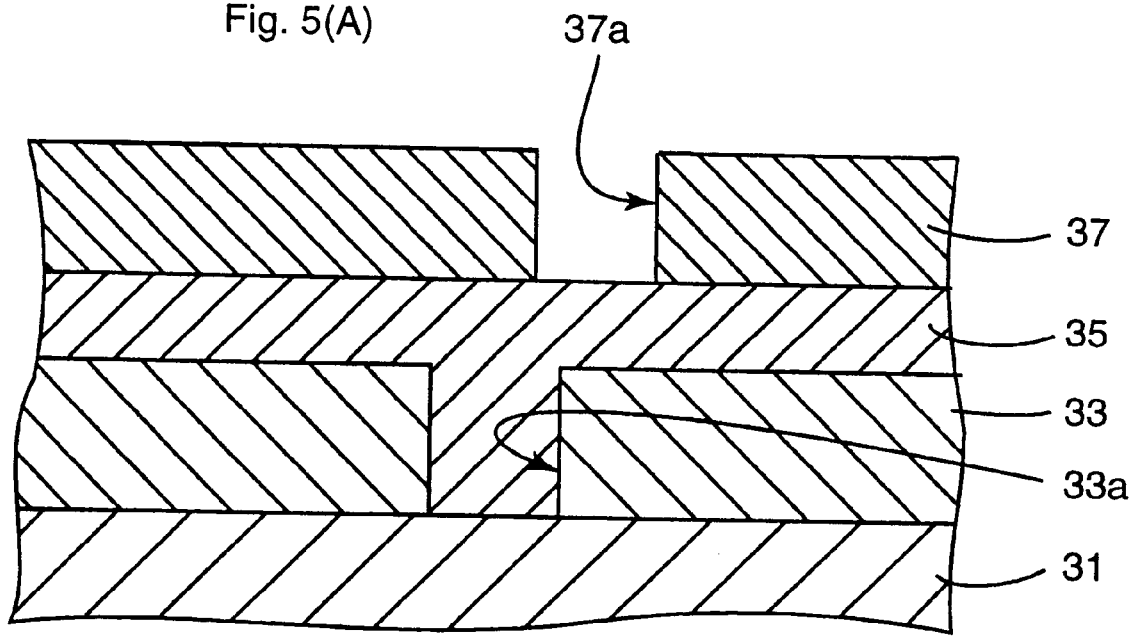
FIG. 5 is a process drawing (No. 1) for describing a second embodiment and is a view showing an example in which the present invention is applied to a method of forming a multilayer interconnection using a W (tungsten) plug.
Figure 5B:
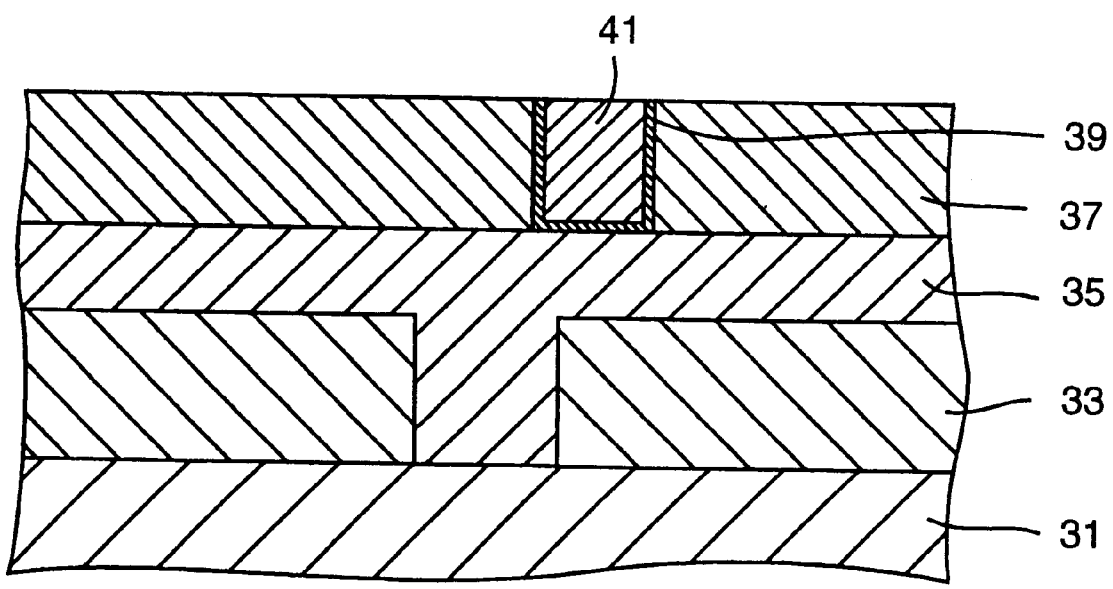
Figure 6A:
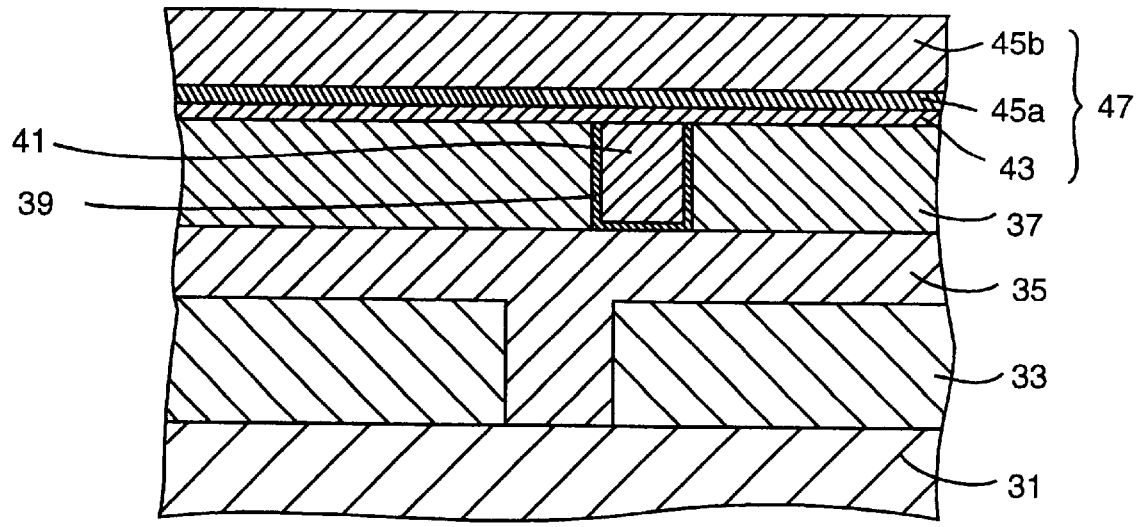
FIG. 6 is a process drawing (No. 2) subsequent to FIG. 5, for describing the second embodiment.

The second embodiment shows a case in which an Al/Ti layered interconnection and a forming method therefor according to the present invention are applied to a multilayer interconnection structure for a semiconductor device. In the present embodiment, a description will be made of an example in which the Al/Ti layered interconnection according to the present invention is applied to interconnections subsequent to a second layer interconnection. Further, a description will be made of an example in which throughholes defined in an intralayer insulating film are implanted by a high melting-point metal plug such as a W (tungsten) plug and the interconnection according to the present invention is formed thereon. This description will be made with reference to FIGS. 5 and 6. FIGS. 5 and 6 are process drawings in which the manner of samples in major ones of processes for forming a multilayer interconnection is shown by cross-sectional views.

An intermediate insulating film 33 is first formed over a silicon substrate 31 and a throughhole 33a is then defined in the intermediate insulating film 33. A first layer interconnection 35 composed of, for example, W (tungsten) is next formed over this sample. Next, an intralayer insulating film 37 is formed over the sample and a throughhole 37a is defined in the intralayer insulating film 37 (see FIG. 5(A)). A TiN layer 39 and a W layer are first formed over the sample with the throughhole 37a defined therein in this order. The W layer is formed thick to such an extent that it is possible to fill up the throughhole 37a. Further, the sample is etchbacked over its entire surface so that a W plug 41 is formed within the throughhole 37a (see FIG. 5(B)).

Figure 6B:
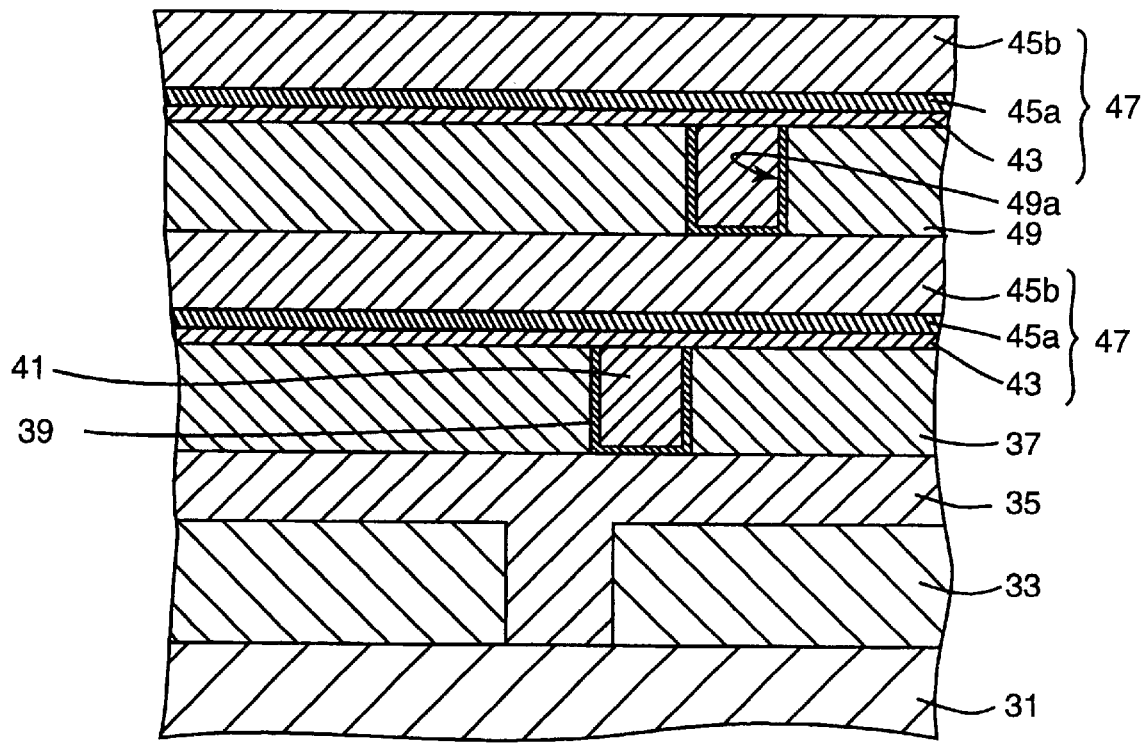

A Ti layer 43, a first Al layer 45a containing Si (silicon) in a concentration capable of retarding the interface reaction between Ti and Al, and a second Al layer 45b whose Si concentration becomes a concentration lower than a concentration allowing the Al layer to produce pinholes even at the maximum, are all continuously deposited over the sample with the W plug 41 already formed therein, without breaking vacuum by the sputtering process. An on-sputtering condition for forming these layers 43, 45a and 45b can be set to the condition falling within the range described in the first embodiment. As a method of continuously forming these layers 43, 45a and 45b, either one of the two methods described in the first embodiment may be selected. Since the Ti layer has resistivity corresponding to ten times the resistivity of Al at this time, its wiring resistance increases when the thickness of the Ti layer is excessively thick and Ti does not produce a film when the thickness thereof is excessively thin. Therefore, the thickness of the Ti layer is set to about 50 nm, for example. Since the thickness of the first Al layer 45a may be preferably determined as thin as possible assuming that it can retard the reaction between Ti and Al, the thickness thereof is set to about 50 nm, for example. Further, the concentration of Si contained in the first Al layer 45a is set to, for example, 0.8 per cent by weight for Al. The thickness of the second Al layer 45b is set to thicknesses ranging from 450 nm to 700 nm in total inclusive of that of the first Al layer 45a. Described specifically, the thickness of the second Al layer 45b is selected so that a desired wiring resistance is obtained in consideration of the relationship between the width of each interconnection and the film thickness. Further, the concentration of Si contained in the second Al layer 45b is set to 0.3 per cent or less by weight for Al (the percent content of Si may be of course zero). Next, these layers 43, 45a and 45b are patterned to a second layer interconnection configuration and sintered to obtain a second layer interconnection 47 (see FIG. 6(A)). Incidentally, the order of the patterning and sintering may be reversed. Further, when it is desired to form third and later layer interconnections, an intralayer insulating film 49 corresponding to a second layer is deposited as shown in FIG. 6(B) and a throughhole 49a is thereafter defined in the intralayer insulating film 49. Afterwards, the processes described with reference to FIGS. 5(B) through 6(B) are repeated.

The second embodiment has described the case wherein the Al/Ti layered interconnection according to the present invention is applied to the second and later interconnections. This is because since Ti poses poor barrier to Al, an Al spike is produced when the Al/Ti layered interconnection is used in a state of being in direct contact with the silicon substrate 31 upon using the Al/TI layered interconnection as the first layer interconnection, so that a leak failure may occur. However, if the Al/Ti layered interconnection 47 (see structure shown in FIG. 6(A)) according to the present invention is applied as the first layer interconnection 35 after the implantation of the W plug in the throughhole 33a of the intermediate insulating film 33 in the process described using FIG. 5(A), then the W plug can prevent the Al spike from occurring. Therefore, the Al/Ti layered interconnection according to the present invention can be also applied as the first layer interconnection.

A third embodiment of the present invention will next be described.

Figure 7A:
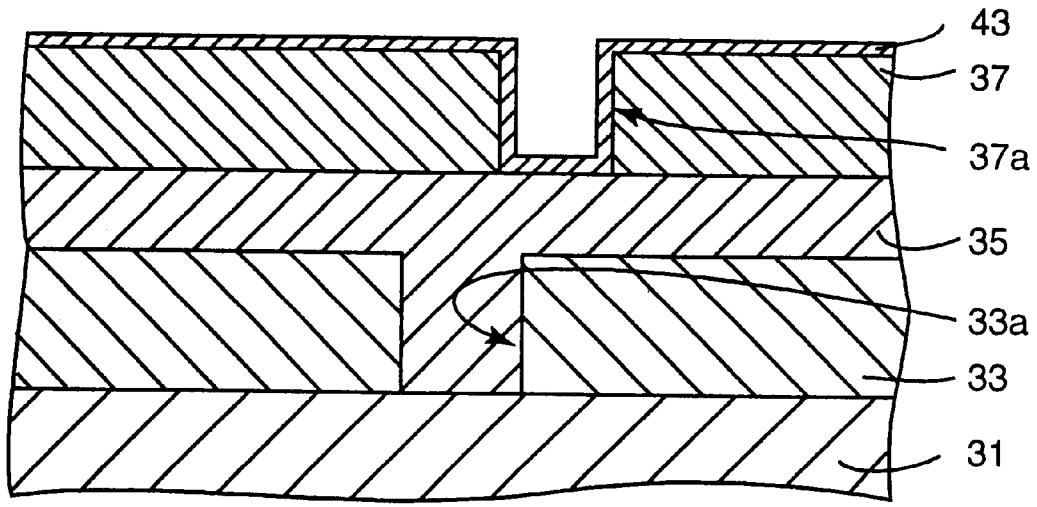
FIG. 7 is a process drawing (No. 1) for describing a third embodiment and is a view showing an example in which the present invention is applied to a method of forming a multilayer interconnection using an Al high-temperature sputtering process or Al high-temperature reflowing process.
Figure 7B:
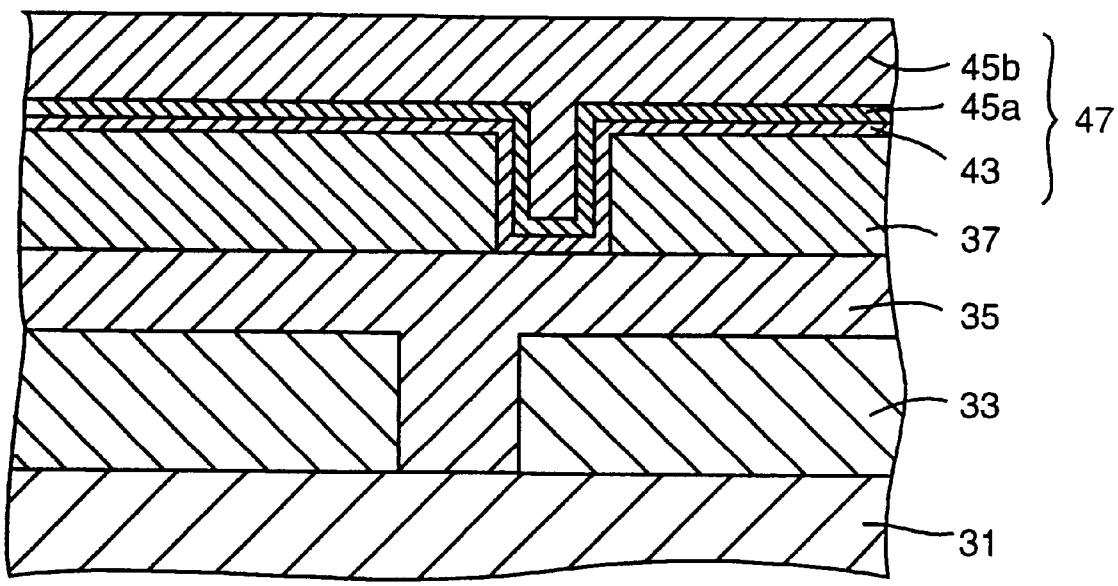
Figure 8:
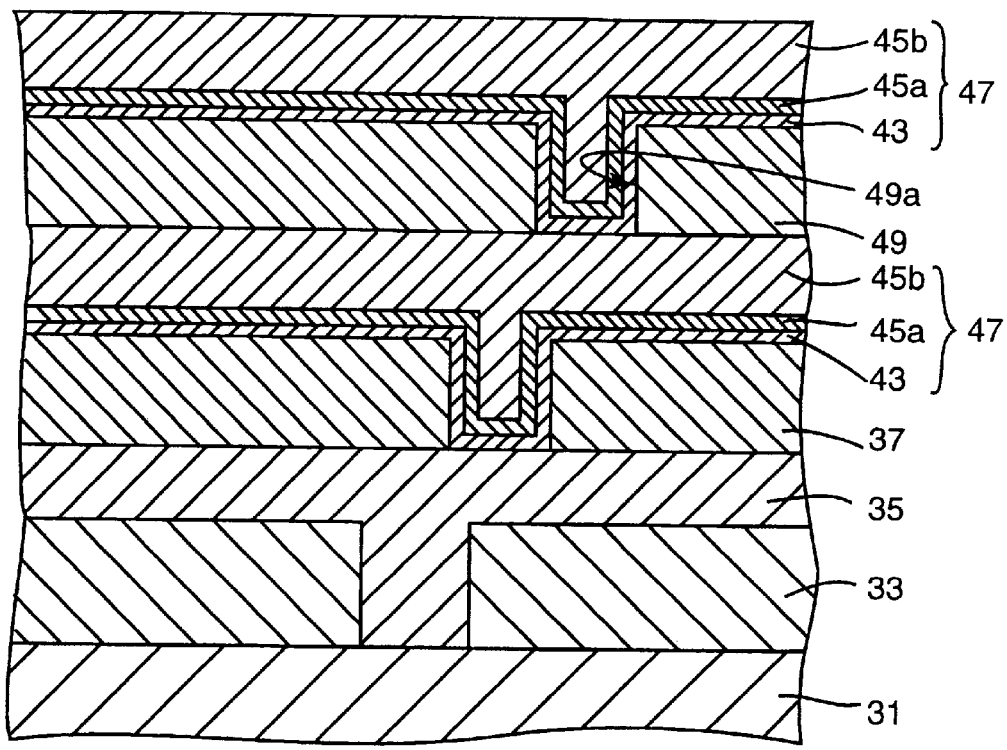
FIG. 8 is a process drawing (No. 2) subsequent to FIG. 7, for describing the third embodiment.
Figure 9:
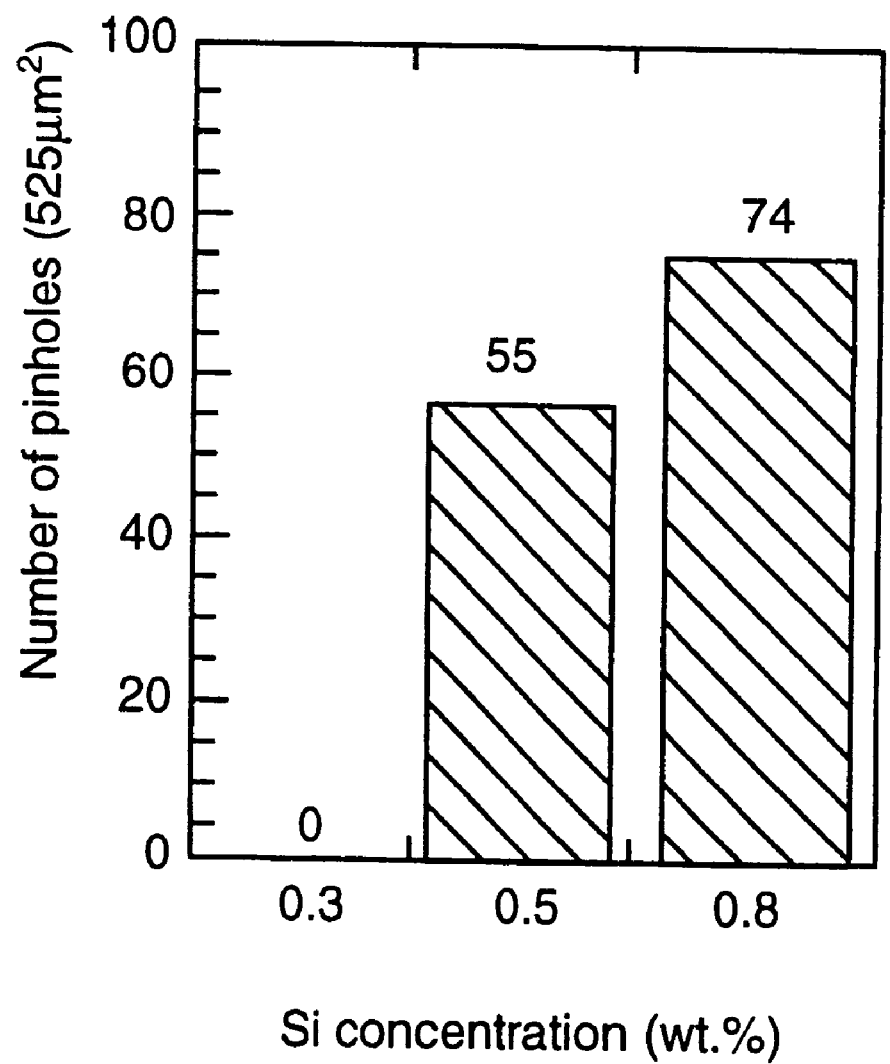
FIG. 9 is a view for describing the relationship between the concentration of Si contained in an Al layer of an Al/Ti layered interconnection and the occurrence of pinholes therein.

The aforementioned second embodiment has described the case in which the W plug is used. However, a method called "Al high-temperature sputtering" (for example, a reference: IEEE VLSI Multilevel Interconnection Conference, 1990, p.42) and a method called "Al high-temperature reflowing" (e.g., a reference: IEEE VLSI Multilevel Interconnection Conference, 1991, p.326) are also known as a method of forming a multilayer interconnection structure. The Al/Ti layered interconnection of the present invention can be applied even to these methods. The third embodiment will describe examples of these methods. This description will be made with reference to FIGS. 7 and 8. FIGS. 7 and 8 are respectively process drawings in which the manner of samples in major ones of processes for forming the multilayer interconnection is shown by cross-sectional views.

In accordance with the procedure described in the second embodiment, an intermediate insulating film 33 is formed above a silicon substrate 11 and a throughhole 33a is defined in the intermediate insulating film 33. Further, a first layer interconnection 35 composed of W (tungsten), an intralayer insulating film 37 and a throughhole 37a are respectively formed over the intermediate insulating film 33. Next, a Ti layer 43 is formed above the sample by the sputtering process (see FIG. 7(A)). An on-sputtering condition for forming the Ti layer 43 can be set to the condition falling within the range described in the first embodiment. Next, a first Al layer 45a containing Si (silicon) in a concentration capable of retarding the interface reaction between Ti and Al, and a second Al layer 45b whose Si concentration becomes a concentration lower than a concentration allowing the Al layer to produce pinholes even at the maximum, are continuously deposited over the sample by the sputtering process without breaking vacuum. As a method of continuously forming these layers 45a and 45b, either one of the two methods described in the first embodiment may be selected. In regard to an on-sputtering condition for forming the first Al layer 45a and the second Al layer 45b, the film-forming temperature can be set to, for example, a temperature range from 450° C. to 500° C. if Al is allowed to reflow upon film formation (i.e., if the high-temperature sputtering process is executed). Further, the pressure applied to a film-forming chamber can be set to suitable pressures ranging from 1 mTorr to 6 mTorr and the power can be set to suitable powers ranging from 8 KW to 12 KW. Thus, the inside of the throughhole 37a is filled with the first Al layer 45a and the second Al layer 45b. Further, an Al/Ti layered interconnection 47 is formed over the sample. In order to enhance a coating characteristic on the throughhole 37a, the film-forming temperature at the time of the formation of the first Al layer 45a may preferably be set to a low temperature of 150° C. or less. Another method may be used to form the first Al layer 45a and the second Al layer 45b. Namely, a method (high-temperature reflowing process) may be used wherein the first Al layer 45a and the second Al layer 45b are deposited on each other in the neighborhood of room temperature and thereafter placed in an atmosphere of high temperatures ranging from 450° C. to 500° C. without vacuum break so as to produce reflow, thereby embedding the Al layers 45a and 45b in the throughhole 37a. The thicknesses and Si concentrations of the first Al layer 45a and second Al layer 45b can be set to the thicknesses and Si concentrations described in the second embodiment, for example. Further, when it is desired to form third and later layer interconnections, an intralayer insulating film 49 corresponding to a second layer is deposited as shown in FIG. 8 and a throughhole 49a is thereafter defined in the intralayer insulating film 49. Afterwards, the processes described using FIG. 7(A) through 8 are repeated. According to the methods described in the third embodiment, since the embedding of the throughhole and the formation of the Al/Ti layered interconnection can be simultaneously carried out, throughput can be improved as compared with the second embodiment.

The embodiments each illustrative of the Al/Ti layered interconnection and the forming method therefor according to the present invention have been described above. However, the present invention is not necessarily limited to the aforementioned embodiments. In the above description, the Al alloy including Cu has been mentioned as the Al layer. However, an Al layer composed of Al and Si may be substantially used. Alternatively, an Al layer containing one element selected from other elements other than Cu, e.g., Ti, Ni (nickel), Co (cobalt) and Cr (chromium) or a plurality of elements may be used as the Al layer.

According to the Al/Ti layered interconnection of the present invention as is apparent from the above description, an Al layer contains Si (silicon) in a portion adjacent to a Ti layer in a concentration capable of retarding an interface reaction between Ti and Al. Further, the Al layer is formed such that the concentration of Si contained in a portion located on the side above the adjacent portion is set to a concentration lower than a concentration allowing the upper Al layer portion to produce pinholes even at the maximum.

Therefore, an Al/Ti layered interconnection is obtained which has the Al layer of a structure wherein Si is contained by a needed amount only in the portion required to retard the reaction between Ti and Al and Si is not contained to the utmost in portions other than the above portion (inclusive of the case where no Si is contained therein). It is thus possible to realize an Al/Ti layered interconnection capable of retarding the reaction between Ti and Al and preventing the pinholes from occurring.

Further, according to the Al/Ti layered interconnection forming method of the present invention, an Al/Ti layered interconnection can be easily formed which is capable of retarding the reaction between Ti and Al and preventing pinholes from occurring.

Thus, the present invention can be applied to interconnections for a more-micronized semiconductor device and its formation or the like.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An Al/Ti layered interconnection comprising:
    a first layer including Ti (titanium); and
    an Al layer composed of Al (aluminum) or an Al alloy;
    said first layer and said Al layer being formed over a base in this order;
    said Al layer containing Si in a portion adjacent to said first layer in a concentration capable of retarding an interface reaction between said first and said Al layers, being formed such that the concentration of Si in an Al layer portion located on the side above said adjacent portion is set to a concentration lower than a concentration allowing the upper Al layer portion to produce pinholes even at the maximum.

2. An Al/Ti layered interconnection as claimed in claim 1, wherein the concentration of Si contained in said upper Al layer portion is 0.3 per cent by weight even at the maximum.

3. An Al/Ti layered interconnection as claimed in claim 1, wherein the thickness of said upper Al layer portion is thicker than that of the Al layer portion corresponding to the portion adjacent to said Ti layer.

4. A method of forming an Al/Ti layered interconnection, comprising the following steps:
    a step for forming a first layer including Ti (titanium) over a base; and
    a step for forming an Al layer composed of Al or an Al alloy over the first layer; and
    wherein said Al layer is formed by continuously executing under vacuum, a first step for forming an Al layer portion on condition that Si is contained in the Al layer in a concentration capable of retarding an interface reaction between said first and said Al layers and a second step for forming an Al layer portion on condition that Si is uncontained in said Al layer or the concentration of Si becomes a concentration lower than a concentration allowing the Al layer to produce pinholes even at the maximum.

5. A method as claimed in claim 4, wherein said second step is a step for forming an Al layer in which the concentration of Si is 0.3% by weight even at the maximum.

6. A method as claimed in claim 4, wherein the Al layer portion formed in said second step is produced so as to be thicker than the Al layer portion formed in said first step.

7. A method of forming an Al/Ti layered interconnection, comprising the following steps:
    a step for forming a first layer including Ti (titanium) over a base; and
    a step for forming an Al layer composed of Al or an Al alloy over the first layer; and
    wherein said Al layer is formed within the same film-forming chamber by a sputtering process using a target uncontaining Si or a target containing Si in a concentration lower than a concentration for allowing the Al layer to produce pinholes even if Si is contained and by continuously executing under vacuum, a first step for forming an Al layer portion using a mixed gas as a sputter gas, which is composed of an inert gas and a silane gas, said mixed gas including a silane gas so that the concentration of Si in the formed Al layer becomes a concentration capable of retarding an interface reaction between said first and said Al layers, and a second step for forming an Al layer portion using an inert gas as a sputter gas.

8. A method as claimed in claim 7, wherein said second step is a step for forming an Al layer in which the concentration of Si is 0.3% by weight even at the maximum.

9. A method as claimed in claim 7, wherein the Al layer portion formed in said second step is produced so as to be thicker than the Al layer portion formed in said first step.

10. An interconnection structure suitable for use in a semiconductor device, comprising:
    a substrate;
    a first interconnection layer formed over said substrate and comprised of titanium;
    a second interconnection layer formed above said first layer and composed principally of aluminum and silicon having a concentration of 0.3 per cent or less by weight; and
    an interface layer formed between said first interconnection layer and said second interconnection layer and composed principally of aluminum and silicon having a concentration of 0.8 per cent or more by weight.

11. An interconnection structure as claimed in claim 10, wherein the thickness of said second interconnection layer is thicker than that of said interface layer.

12. An interconnection structure as claimed in claim 11, wherein said second interconnection layer contains one of copper, titanium, nickel, cobalt and chromium or a plurality of metals.

13. An interconnection structure suitable for use in a semiconductor device, comprising:
    a substrate;
    a first interconnection layer formed over said substrate and comprised of titanium; and
    a second interconnection layer formed over said first interconnection layer and composed principally of aluminum and silicon having a high-concentration region and a low-concentration region, said high-concentration region being formed in an interface between said second interconnection layer and said first interconnection layer.

14. An interconnection structure as claimed in claim 13, wherein said high-concentration region is a concentration of 0.8 per cent or more by weight and said low-concentration region is a concentration of 0.3 per cent or less by weight.

15. An interconnection structure as claimed in claim 14, wherein the thickness of said second interconnection layer is thicker than that of said interface layer.

16. An interconnection structure as claimed in claim 15, wherein said second interconnection layer contains one of copper, titanium, nickel, cobalt and chromium or a plurality of metals.

17. An Al/Ti layered interconnection comprising:

a first layer including Ti (titanium); and an Al layer composed of Al (aluminum) or an Al alloy;

said first layer and said Al layer being formed over a base in this order;

said Al layer containing Si in a portion adjacent to said first layer in a concentration capable of retarding an interface reaction between said first and said Al layers, being formed such that the concentration of Si in an Al layer portion located on the side above said adjacent portion is set to a concentration lower than a concentration allowing the upper Al layer portion to produce pinholes even at the maximum.

18. An Al/Ti layered interconnection as claimed in claim 17, wherein the concentration of Si contained in said upper Al layer portion is 0.3 per cent by weight even at the maximum.

19. An Al/Ti layered interconnection as claimed in claim 17, wherein the thickness of said upper Al layer portion is thicker than that of the Al layer portion corresponding to the portion adjacent to said Ti layer.

20. A method of forming an Al/Ti layered interconnection, comprising the following steps:

a step for forming a first layer including Ti (titanium) over a base; and a step for forming an Al layer composed of Al or an Al alloy over the first layer; and wherein said Al layer is formed by continuously executing under vacuum, a first step for forming an Al layer portion on condition that Si is contained in the Al layer in a concentration capable of retarding an interface reaction between said first and said Al layers and a second step for forming an Al layer portion on condition that Si is uncontained in said Al layer or the concentration of Si becomes a concentration lower than a concentration allowing the Al layer to produce pinholes even at the maximum.

21. A method as claimed in claim 20, wherein said second step is a step for forming an Al layer in which the concentration of Si is 0.3% by weight even at the maximum.

22. A method as claimed in claim 20, wherein the Al layer portion formed in said second step is produced so as to be thicker than the Al layer portion formed in said first step.

23. A method of forming an Al/Ti layered interconnection, comprising the following steps:

a step for forming a first layer including Ti(titanium) over a base; and a step for forming an Al layer composed of Al or an Al alloy over the first layer; and wherein said Al layer is formed within the same film-forming chamber by a sputtering process using a target uncontaining Si or a target containing Si in a concentration lower than a concentration for allowing the Al layer to produce pinholes even if Si is contained and by continuously executing under vacuum, a first step for forming an Al layer portion using a mixed gas as a sputter gas, which is composed of an inert gas and a silane gas, said mixed gas including a silane gas so that the concentration of Si in the formed Al layer becomes a concentration capable of retarding an interface reaction between said first and said Al layers, and a second step for forming an Al layer portion using an inert gas as a sputter gas.

24. A method as claimed in claim 23, wherein said second step is a step for forming an Al layer in which the concentration of Si is 0.3% by weight even at the maximum.

25. A method as claimed in claim 23, wherein the Al layer portion formed in said second step is produced so as to be thicker than the Al layer portion formed in said first step.

* * * * *